United States Patent
Yeo

(10) Patent No.: US 9,581,839 B2
(45) Date of Patent: Feb. 28, 2017

(54) METHOD OF MANUFACTURING DISPLAY DEVICE AND MANUFACTURING APPARATUS FOR THE SAME

(71) Applicant: Samsung Display Co., Ltd., Yongin, Gyeonggi-Do (KR)

(72) Inventor: Gilhwan Yeo, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 13 days.

(21) Appl. No.: 14/738,540

(22) Filed: Jun. 12, 2015

(65) Prior Publication Data
US 2016/0195753 A1 Jul. 7, 2016

(30) Foreign Application Priority Data

Jan. 7, 2015 (KR) .................. 10-2015-0002026

(51) Int. Cl.
*H01L 51/52* (2006.01)
*H01L 27/32* (2006.01)
(Continued)

(52) U.S. Cl.
CPC ............ *G02F 1/1303* (2013.01); *H01L 51/56* (2013.01); *B32B 38/18* (2013.01); *B32B 38/1808* (2013.01); *B32B 38/1825* (2013.01); *B32B 38/1858* (2013.01); *B32B 39/00* (2013.01); *B32B 2457/20* (2013.01); *B65G 49/061* (2013.01);
(Continued)

(58) Field of Classification Search
CPC ............ H01L 51/5253; H01L 51/5237; H01L 51/5256; H01L 51/56; H01L 51/0097; H01L 27/3223; H01L 2251/5338; B32B 38/18; B32B 38/1808; B32B 38/1825;
(Continued)

(56) References Cited

U.S. PATENT DOCUMENTS 6,750,922 B1 *   6/2004   Benning ............... G06F 1/1609
                                                                348/818
8,243,424 B1 *   8/2012   Babu .................... G06F 1/1601
                                                                361/679.01
(Continued)

FOREIGN PATENT DOCUMENTS

KR   10-2012-0045682 A   5/2012
KR   10-2013-0117112 A   10/2013
KR   10-2014-0045837 A   4/2014

*Primary Examiner* — Essama Omgba
(74) *Attorney, Agent, or Firm* — Knobbe Martens Olson & Bear LLP

(57) ABSTRACT

The described technology generally relates to a method of manufacturing a display device and a manufacturing apparatus for the same. In one aspect, the method includes placing a carrier, in which a display panel is formed, into a film attachment portion such that the carrier is pulled onto a carrier adsorption surface of a first stage. The method also includes attaching a first protection film onto a first surface of the display panel in the film attachment portion, wherein the first surface is located opposite to a second surface of the display panel that faces the carrier. The method also includes first transferring the first stage to a carrier separation portion, separating the display panel from the carrier, and second transferring the display panel to a second stage such that the attached protection film is pulled onto a second film adsorption surface of the second stage.

8 Claims, 11 Drawing Sheets

(51) Int. Cl.
*H01L 51/00* (2006.01)
*H01L 51/56* (2006.01)
*G02F 1/13* (2006.01)
*B32B 38/18* (2006.01)
*B32B 39/00* (2006.01)
*B65G 49/06* (2006.01)

(52) U.S. Cl.
CPC ...... *B65G 2249/04* (2013.01); *B65H 2801/61* (2013.01); *G02F 2201/50* (2013.01); *H01L 51/5253* (2013.01); *Y10T 29/49829* (2015.01)

(58) Field of Classification Search
CPC . B32B 38/1858; B32B 39/00; B32B 2457/20; Y10T 29/49828; Y10T 29/49829
See application file for complete search history.

(56) References Cited

U.S. PATENT DOCUMENTS

| | | | | |
|---|---|---|---|---|
| 8,833,423 B2* | 9/2014 | Chida | ............... | B29C 63/02 156/759 |
| 8,951,373 B2* | 2/2015 | Ota | ............... | G02F 1/1333 156/247 |
| 8,992,278 B2* | 3/2015 | Ko | ............... | G02F 1/1303 445/24 |
| 9,324,968 B2* | 4/2016 | Lee | ............... | H01L 51/5253 |
| 2005/0199337 A1* | 9/2005 | Nishikubo | ............... | B32B 37/02 156/247 |
| 2010/0033451 A1 | 2/2010 | Shinn et al. | | |
| 2012/0107978 A1 | 5/2012 | Shin et al. | | |
| 2013/0098544 A1* | 4/2013 | Chida | ............... | B29C 63/02 156/249 |
| 2013/0294017 A1* | 11/2013 | Ota | ............... | G02F 1/1333 361/679.01 |
| 2014/0097429 A1 | 4/2014 | Kim et al. | | |
| 2014/0179191 A1* | 6/2014 | Ko | ............... | G02F 1/1303 445/24 |
| 2015/0079707 A1* | 3/2015 | Lee | ............... | H01L 51/5253 438/26 |
| 2015/0086740 A1* | 3/2015 | Shin | ............... | C09J 7/0239 428/41.8 |
| 2015/0124383 A1* | 5/2015 | Ota | ............... | G02F 1/1333 361/679.01 |
| 2016/0195753 A1* | 7/2016 | Yeo | ............... | G02F 1/13452 29/428 |

* cited by examiner

METHOD OF MANUFACTURING DISPLAY DEVICE AND MANUFACTURING APPARATUS FOR THE SAME

INCORPORATION BY REFERENCE TO ANY PRIORITY APPLICATIONS

This application claims the benefit of Korean Patent Application No. 10-2015-0002026, filed on Jan. 7, 2015, in the Korean Intellectual Property Office, the disclosure of which is incorporated herein in its entirety by reference.

BACKGROUND

Field

The described technology generally relates to a method of manufacturing a display device and a manufacturing apparatus for the same.

Description of the Related Technology

In general, during the manufacturing of a flat panel display device, a protection film is attached so as to protect the display surface of a display panel or a reverse side thereof. The protection film can be intended to be temporarily attached during manufacturing and yet remain attached in the final product.

SUMMARY OF CERTAIN INVENTIVE ASPECTS

One inventive aspect relates to a method of manufacturing a display device having a simplified configuration and a manufacturing apparatus for the same.

Another aspect is a display manufacturing apparatus that includes a film attachment unit including a first chamber body including a first main entrance located at one side thereof and an auxiliary entrance located at another side thereof, and allowing protection films to be attached to a display, wherein the display is insertable or removable through the first main entrance or the auxiliary entrance; a carrier separation unit including a second chamber body including a second main entrance located at one side thereof, and separating the display from the carrier supporting the display, wherein the display is insertable or removable through the second main entrance; a transfer disposed between the film attachment unit and the carrier separation unit and for allowing the display separated from the carrier to be seated; a first stage for going and coming between the film attachment unit and the carrier separation unit through the auxiliary entrance and the second main entrance and including a first film adsorption surface that adsorbs the carrier in which the display is formed in one surface, and a second film adsorption surface that adsorbs the protection film attached to the display in another surface; a second stage includes the film for going and coming between an upper portion of the transfer and the carrier separation unit through the second main entrance and including a second film adsorption surface that adsorbs the protection film attached to the display; and a film stage for adsorbing the protection films that are to be attached to the display seated on the first stage when the first stage is positioned in the film attachment unit.

The film attachment unit can attach the protection films adsorbed onto the film stage onto to a first surface that is opposite to a surface in a carrier direction of the display in a state where the carrier in which the display is formed is adsorbed onto a carrier adsorption surface of the first stage or attach the protection films attached to the film stage onto to a second surface that is opposite to a first surface of the display in a state where the protection films attached to the display is adsorbed onto the first film adsorption surface; the carrier separation unit can separate the display from the carrier which is absorbed onto the carrier adsorption surface of the first stage and adsorb the protection films attached to the first surface of the display to the second stage so that the display is supported by the second stage; and the second stage can allow the display to be seated on the transfer so that the second surface opposite to the first surface of the display faces the transfer, and the first stage can transfer the display to the film attachment unit in a state where the protection films attached to the first surface of the display seated on the transfer is absorbed onto the first film adsorption surface of the first stage so that the display is supported by the first stage.

The number of adsorption holes in the first film adsorption surface can be greater than the number of adsorption holes in the carrier adsorption surface.

The first stage and the second stage can be reversed.

Another aspect is a method of manufacturing a display device, the method including: placing a carrier in which a display is formed into a film attachment unit in a state where the carrier is absorbed onto a carrier adsorption surface of a first stage; attaching a protection film onto a first surface of the display in the film attachment unit, wherein the first surface is opposite to a second surface of the display and the second surface faces the carrier; transferring the first stage on which the carrier is absorbed to a carrier separation unit; separating the display from the carrier which is absorbed onto the carrier adsorption surface, and transferring the display to a second stage so that the protection film attached to the first surface of the display is absorbed onto a second film adsorption surface of the second stage; transferring the second stage, on which the protection film attached onto the display is absorbed from the carrier separation unit to a transfer; seating the display on the transfer by separating the display from the second stage, wherein the display is seated such that the second surface faces the transfer; removing the carrier from the first stage after separating the display from the carrier; transferring the display to the film attachment unit in a state where the protection film attached to the first surface of the display seated on the transfer is absorbed onto a first film adsorption surface of the first stage so that the display is supported by the first stage; and attaching a protection film onto the second surface of the display in the film attachment unit.

The method can further include reversing the second stage, between the transferring of the display to the second stage and the transferring of the second stage from the carrier separation unit to the transfer.

The method can further include reversing the second stage, between the transferring of the second stage from the carrier separation unit to the transfer and the seating of the display on the transfer.

The method can further include reversing the first stage, between the removing of the carrier from the first stage and the transferring of the display to the film attachment unit.

The transfer can be positioned between the film attachment unit and the carrier separation unit.

The film attachment unit can include a first chamber body including a first main entrance located at one side thereof and an auxiliary entrance located at another side thereof, and the display is insertable or removable through the first main entrance or the auxiliary entrance, wherein the carrier separation unit includes a second chamber body including a second main entrance located at one side thereof, the display is insertable or removable through the second main entrance, and the second main entrance corresponds to the auxiliary entrance of the film attachment unit, wherein the transferring of the first stage to the carrier separation unit includes transferring the first stage to the carrier separation unit through the auxiliary entrance of the film attachment unit and the second main entrance of the carrier separation unit, wherein the transferring of the second stage from the carrier separation unit to the transfer includes transferring the second stage through the second main entrance of the carrier separation unit; and wherein the transferring of the display to the film attachment unit includes transferring the display through the auxiliary entrance of the film attachment unit.

One surface of the first stage can include the carrier adsorption surface configured to absorb the carrier in which the display is formed and the other surface of the first stage includes the first film adsorption surface configured to absorb the protection film attached to the display.

The number of adsorption holes in the first film adsorption surface can be greater than the number of adsorption holes in the carrier adsorption surface.

Another aspect is a method of manufacturing a display device, the method comprising: placing a carrier, in which a display panel is formed, into a film attachment portion such that the carrier is pulled onto a carrier adsorption surface of a first stage; attaching a first protection film onto a first surface of the display panel in the film attachment portion, wherein the first surface is located opposite to a second surface of the display panel that faces the carrier; first transferring the first stage to a carrier separation portion; separating the display panel from the carrier; second transferring the display panel to a second stage such that the attached protection film is pulled onto a second film adsorption surface of the second stage; third transferring the second stage, on which the attached protection film is pulled from the carrier separation portion, to a transfer portion; separating the display panel from the second stage; placing the display panel on the transfer portion such that the second surface faces the transfer portion; removing the carrier from the first stage after separating the display panel from the carrier; fourth transferring the display panel to the film attachment portion such that the first protection film is pulled onto a first film adsorption surface of the first stage so that the display panel is supported via the first stage; and attaching a second protection film onto the second surface of the display panel in the film attachment portion.

The method further comprises rotating the second stage, between the second transferring and the third transferring.

The method further comprises rotating the second stage, between the third transferring and the separating.

The method further comprises rotating the first stage, between the removing and the fourth transferring.

In the above method, the transfer portion is positioned between the film attachment portion and the carrier separation portion.

In the above method, the film attachment portion comprises a first chamber body including a first main entrance located at one side thereof and an auxiliary entrance located at another side thereof, wherein the display panel is configured to be inserted or removed through the first main entrance or the auxiliary entrance, wherein the carrier separation portion comprises a second chamber body comprising a second main entrance located at one side thereof, wherein the display panel is further configured to be inserted or removed through the second main entrance, wherein the second main entrance corresponds to the auxiliary entrance of the film attachment portion, wherein the first transferring is performed through the auxiliary entrance of the film attachment portion and the second main entrance of the carrier separation portion, wherein the third transferring is performed through the second main entrance of the carrier separation portion, and wherein the fourth transferring is performed through the auxiliary entrance of the film attachment portion.

In the above method, one surface of the first stage includes the carrier adsorption surface and the other surface of the first stage includes the first film adsorption surface.

In the above method, a plurality of first and second adsorption holes are respectively formed in the first film adsorption surface and carrier adsorption surface, wherein the number of the first adsorption holes is greater than the number of the second adsorption holes.

Another aspect is an apparatus for manufacturing a display device, the apparatus comprising: a carrier configured to pull a display substrate including first and second surfaces opposing each other; a film attachment portion including i) a film stage configured to pull a first protection film and ii) a separator configured to separate the first protection film from the film stage so as to attach the first protection film to the first surface of the display substrate; a carrier separation portion configured to separate the display substrate from the carrier; and a transfer portion configured to transfer the display substrate between the film attachment portion and the carrier separation portion, wherein the film attachment portion is further configured to attach the second protection film to the second surface of the display substrate.

In the above apparatus, the film stage has first and second ends opposing each other, wherein, in a first protection film mode, the film stage is slanted such that the second end is closer to the display substrate than the first end, and wherein, in a second protection film mode, the film stage is slanted such that the second end is farther from the display substrate than the first end.

In the above apparatus, the film attachment portion includes first and second entrances i) located on opposite ends of the film attachment portion and ii) through which the display substrate is configured to enter and exit the film attachment portion.

In the above apparatus, the carrier separation portion includes a third entrance and through which the display substrate is configured to enter and exit the carrier separation portion.

The apparatus further comprises a second stage configured to pull the first protection film so as to separate the first protection film and the display substrate from the carrier inside the carrier separation portion.

In the above apparatus, the first stage has a plurality of first adsorption holes formed therethrough, wherein the second stage has a plurality of second adsorption holes formed therethrough, and wherein the number of the first adsorption holes is greater than the number of the second adsorption holes.

In the above apparatus, the transfer portion is further configured to separate the second stage from the display substrate so as to expose the first protection film to the environment.

In the above apparatus, the transfer portion includes a plurality of pins configured to receive the display substrate.

In the above apparatus, the transfer portion is configured to rotate the display substrate such that the display substrate contacts the display substrate.

In the above apparatus, the separator includes i) a plurality of wheels formed on opposite sides thereof and ii) a plurality of rails formed on the opposite sides of the separator and accommodating the wheels.

In the above apparatus, the separator is further configured to pressurize the first and second protection films onto the display substrate when the first and second protection films are separated from the film stage.

In the above apparatus, the first stage includes a carrier adsorption surface configured to pull the carrier and a first protection film adsorption surface configured to pull the first protection film.

DETAILED DESCRIPTION OF CERTAIN INVENTIVE EMBODIMENTS

Figure 1:
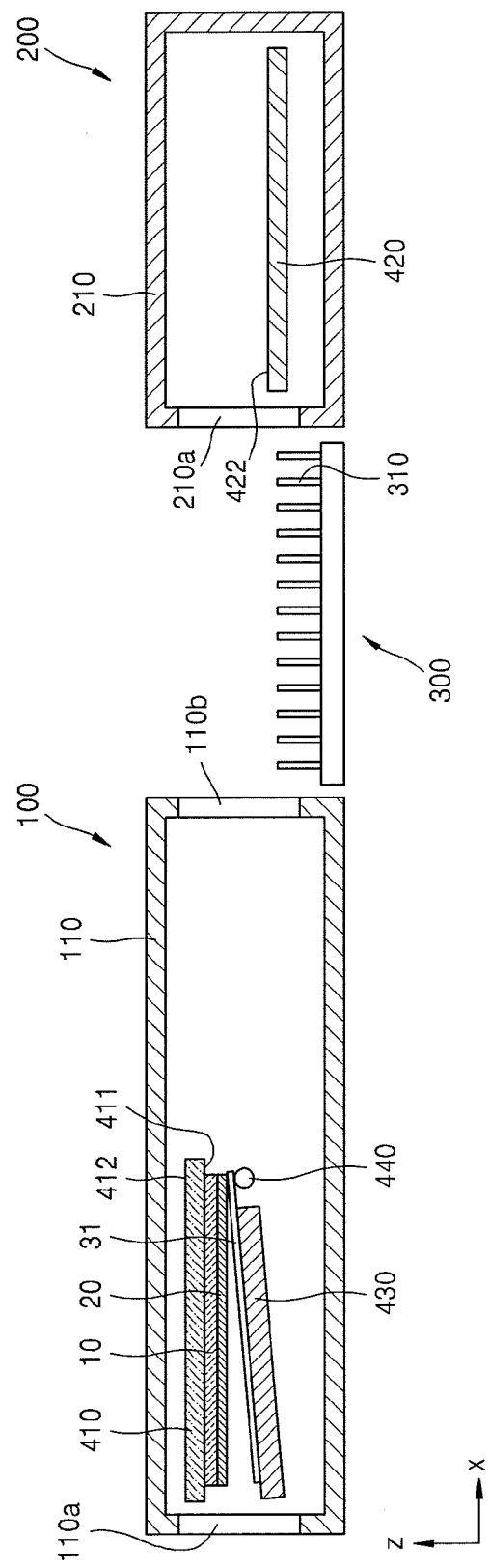
FIGS. 1, 2, 3, 4, 5, 6, 7, 8, and 9 are schematic cross-sectional views of processes of a method of manufacturing a display device, according to an embodiment.

Typically, attaching protection films to two opposing surfaces of a display panel can make display manufacturing more complex.

Reference will now be made in detail to exemplary embodiments, examples of which are illustrated in the accompanying drawings, wherein like reference numerals refer to like elements throughout. In this regard, the present exemplary embodiments can have different forms and should not be construed as being limited to the descriptions set forth herein. Accordingly, the exemplary embodiments are merely described below, by referring to the figures, to explain aspects of the present description.

It will be understood that when a layer, region, or component is referred to as being "formed on," another layer, region, or component, it can be directly or indirectly formed on the other layer, region, or component. That is, for example, intervening layers, regions, or components can be present. Sizes of elements in the drawings can be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and can be interpreted in a broader sense. For example, the x-axis, the y-axis, and the z-axis can be perpendicular to one another, or can represent different directions that are not perpendicular to one another.

FIGS. 1 through 9 are schematic cross-sectional views of processes of a method of manufacturing a display apparatus or display device, according to an embodiment. The method of manufacturing the display apparatus according to the present embodiment uses a manufacturing apparatus including a film attachment unit or film attachment portion 100, a carrier separation unit or carrier separator 200, and a transfer or transfer portion 300 placed between the film attachment unit 100 and the carrier separation unit 200 as shown in FIG. 1.

First, as shown in FIG. 1, a carrier 10 in which a display or display substrate 20 is formed is positioned in the film attachment unit 100 by adsorbing or pulling the carrier 10 in a carrier adsorption surface 411 of a first stage 410.

The film attachment unit 100 includes a first chamber body 110 that includes a first main entrance 110*a* that can input and output the display 20 through one side (−x direction) and an auxiliary entrance 110*b* that can input and output the display 20 through another side (+x direction). A protection film 31 is attached to the display 20 in the film attachment unit 100.

The carrier 10 can be, for example, glass having a sufficient thickness. The carrier 10 is not an element of a display apparatus but can be temporarily used to manufacture the display panel. That is, for example, when a thin type display or a flexible display panel is manufactured, in order to provide stability, a display panel substrate can be formed on the carrier 10 by using resin such as polyimide or polyethylene terephthalate. Then a thin film transistor (TFT), a display device such as an organic light-emitting diode (OLED), or a thin film encapsulation layer that protects the display device can be formed. The display 20 of FIG. 1 includes a substrate, the display device, and the thin film encapsulation layer.

The carrier 10 is adsorbed or pulled onto the carrier adsorption surface 411 of the first stage 410 in a state where the display 20 is formed on the carrier 10. For example, in a state where the first stage 410 is positioned outside the first chamber body 110 of the film attachment unit 100, the carrier 10 is adsorbed in the carrier adsorption surface 411 of the first stage 410, and then the first stage 410 can be transferred into the first chamber body 110 (in the +x direction) through the first main entrance 110*a* of the first chamber body 110. Alternatively, the carrier 10 can be transferred into the first chamber body 110 through the first main entrance 110*a* by using a transfer robot so that the carrier 10 can be adsorbed to the carrier adsorption surface 411.

The carrier 10 can be adsorbed to the first stage 410 by using, for example, a vacuum adsorption method. In this case, since a plurality of adsorption holes are present in the carrier adsorption surface 411, the carrier 10 is adsorbed onto the carrier adsorption surface 411 and then air in the adsorption holes is pumped to the outside through the adsorption holes. Thus the carrier 10 can be adsorbed onto the first stage 410. A fixing element such as a clamp other than the vacuum adsorption method can be used to fix the carrier 10 to the first stage 410.

When the carrier 10 is adsorbed to the carrier adsorption surface 411 and is positioned in the film attachment unit 100, the protection film 31 is attached on a first surface that is opposite to a surface in a direction of the carrier 10 (+z direction). This can be performed by using various methods. As shown in FIG. 1, in a state where the protection film 31 is adsorbed to a film stage 430, a part of the protection film 31 is pressurized onto the display 20 through a roller or separator 440, and then the first stage 410 is moved (in the +x direction).

Figure 2:
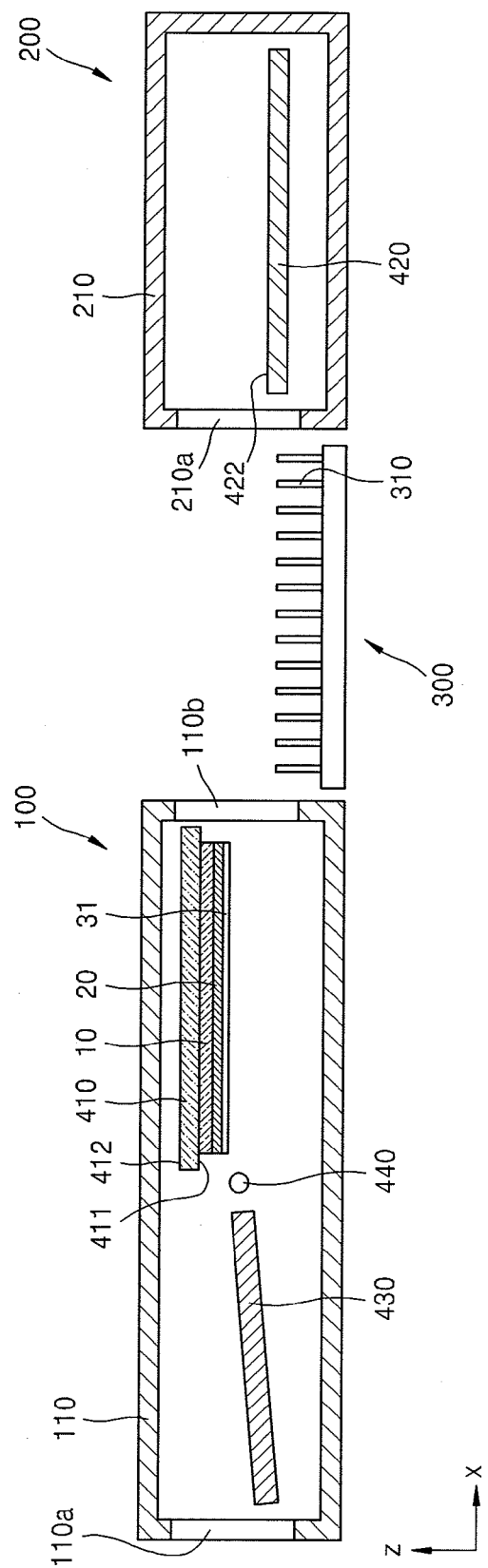

In this regard, the film stage 430 can be tilted in such a manner that a tip or end closer to the auxiliary entrance 110*b* is positioned closer to the display 20 than a tip or end closer to the first main entrance 110*a* as shown in FIG. 1. In such a state, the tip closer to the auxiliary entrance 110*b* is pressurized to the tip closer to the auxiliary entrance 110*b* through the roller 440. Thereafter, if the first stage 410 is moved to the direction of the auxiliary entrance 110*b* (+x direction) from the first main entrance 110*a*, as shown in FIG. 2, the protection film 31 is naturally separated from the film stage 430 and is attached onto the display 20. The protection film 31 can be cut in a size corresponding to the display 20 in advance.

The protection film 31 can be adsorbed to the film stage 430 by using, for example, the vacuum adsorption method. In this case, since a plurality of adsorption holes are present in the film stage 430, the protection film 31 is seated on the film stage 430 and then air in the adsorption holes is pumped to the outside through the adsorption holes. Thus the protection film 31 can be adsorbed onto the film stage 430. As shown in FIG. 1, before or when the protection film 31 is attached onto the display 20, the film stage 430 does not adsorb the protection film 31 any longer by using the vacuum adsorption method but the protection film 31 can be simply laid on the film stage 430.

The film stage 430 can be moved to the inside of the first chamber body 110 or the outside of the first chamber body 110 through the first main entrance 110a as necessary. For example, the protection film 31 is adsorbed to the outside of the first chamber body 110 and then moved into the first chamber body 110. In another example, the protection film 31 is supplied from the outside in a state where the protection film 31 is positioned inside the first chamber body 110 and can be adsorbed onto the film stage 430. The film stage 430 or the protection film 31 can be moved to the inside and outside of the first chamber body 110 through a separate entrance other than the first main entrance 110 of the first chamber body 110.

Figure 3:
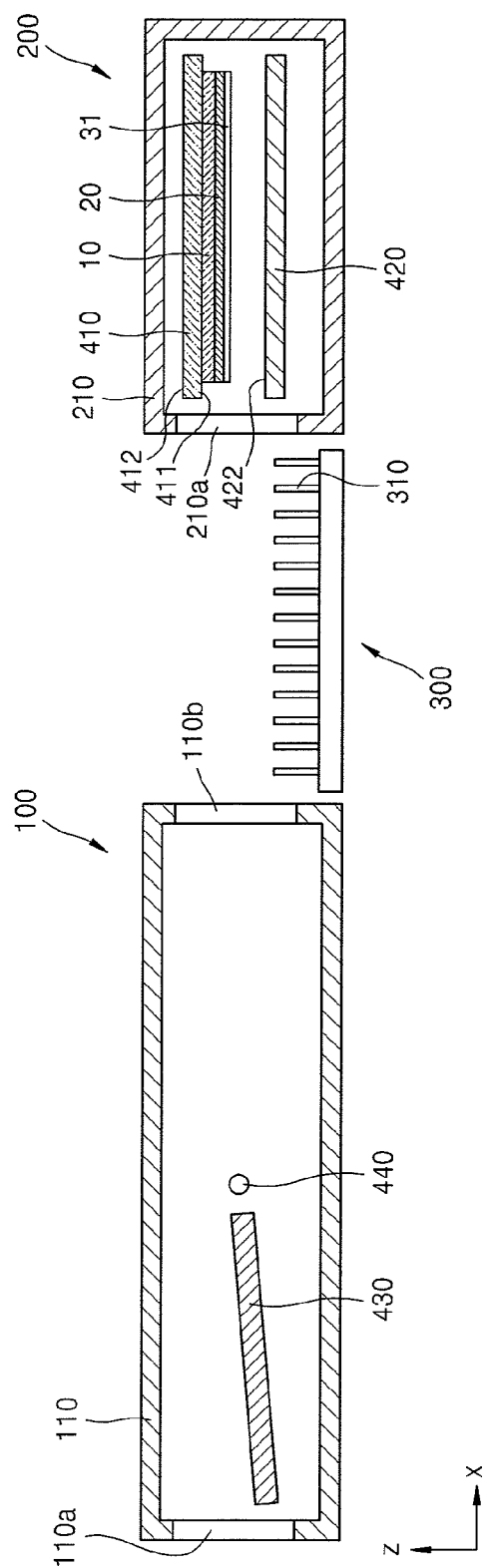

Thereafter, as shown in FIG. 3, the first stage 410 is transferred to the carrier separation unit 200.

Figure 4:
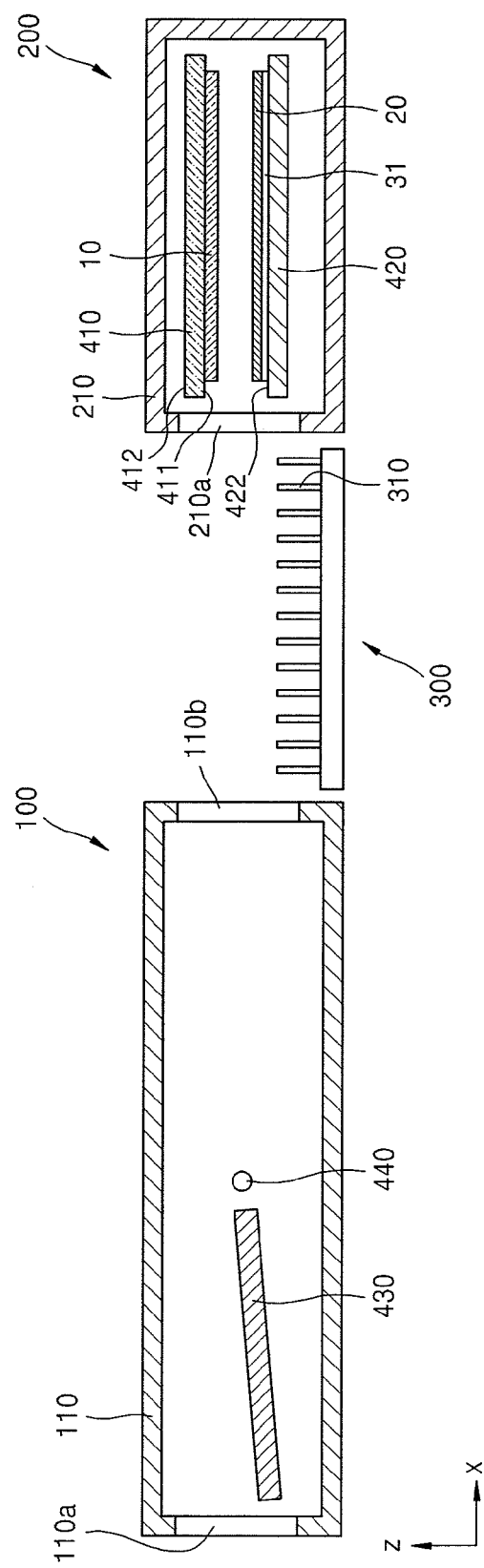

The carrier separation unit 200 includes a second chamber body 210 that includes a second main entrance 210a that can input and output the display 20 in one side (−x direction) to correspond to the auxiliary entrance 110b. The first stage 410 is transferred to the second chamber body 210 through the second main entrance 210a. The display 20 can be separated from the carrier 10 supporting the display 20 in the carrier separation unit 200. For example, the display 20 is separated from the carrier 10 adsorbed to the carrier adsorption surface 411 in the carrier separation unit 200, as shown in FIG. 4, and the protection film 31 attached onto the first surface of the display 20 is adsorbed to a film adsorption surface 422 of the second stage 420. Thus the display 20 is supported by the second stage 420.

This can be performed in various ways. For example, as shown in FIG. 3, after the first stage 410 is transferred to the carrier separation unit 200, the distance between the first stage 410 and the second stage 420 is reduced and the film adsorption surface 422 contacts the protection film 31 attached onto the first surface of the display 20. Then, the protection film 31 can be adsorbed to the film adsorption surface 422 by using the vacuum adsorption method. In this state, the display 20 is separated from the carrier 10 by irradiating a laser beam, and then the distance between the first stage 410 and the second stage 420 is increased again. Thus, as shown in FIG. 4, the carrier 10 is adsorbed to and supported by the carrier adsorption surface 411 of the first stage 410, and the protection film 31 attached to the first surface of the display 20 is adsorbed to the film adsorption surface 422, the display 20 separated from the carrier 10 can be supported by the second stage 420.

Figure 5:
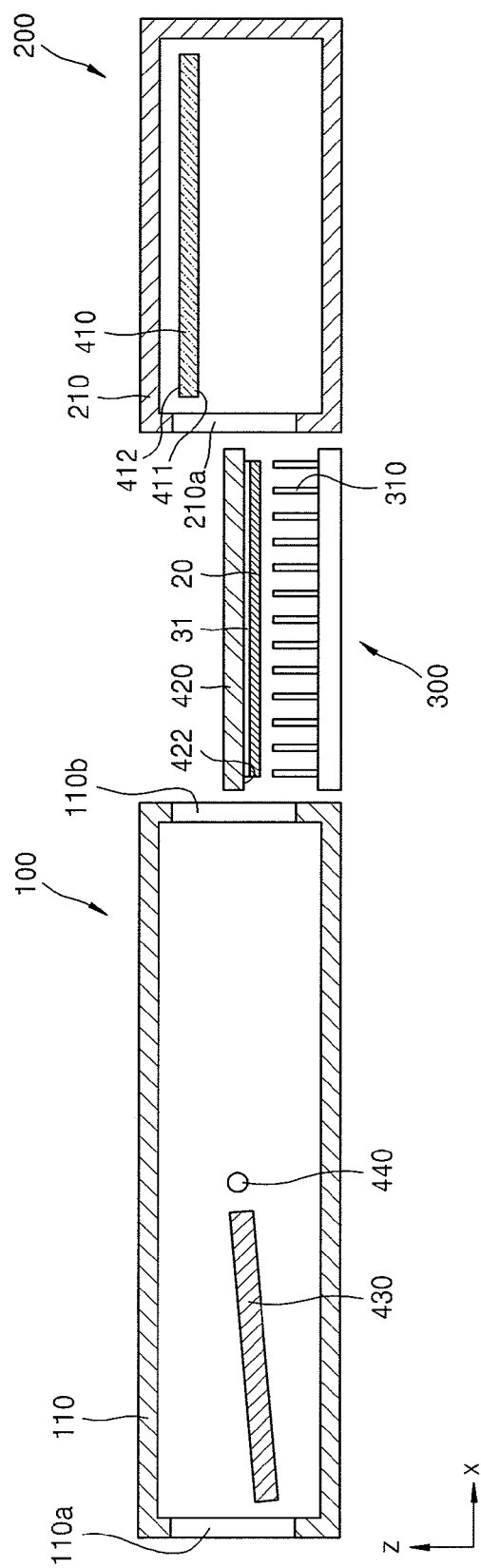

As shown in FIG. 5, the second stage 420 is transferred to the transfer 300 from the carrier separation unit 200 through the second main entrance 210a. Both the first stage 410 and the second stage 420 are moved to the carrier separation unit 200 through the same second main entrance 210a but the described technology is not limited thereto. For example, a main entrance for the first stage 410 and a main entrance for the second stage 420 are separately present in the second chamber body.

Figure 6:
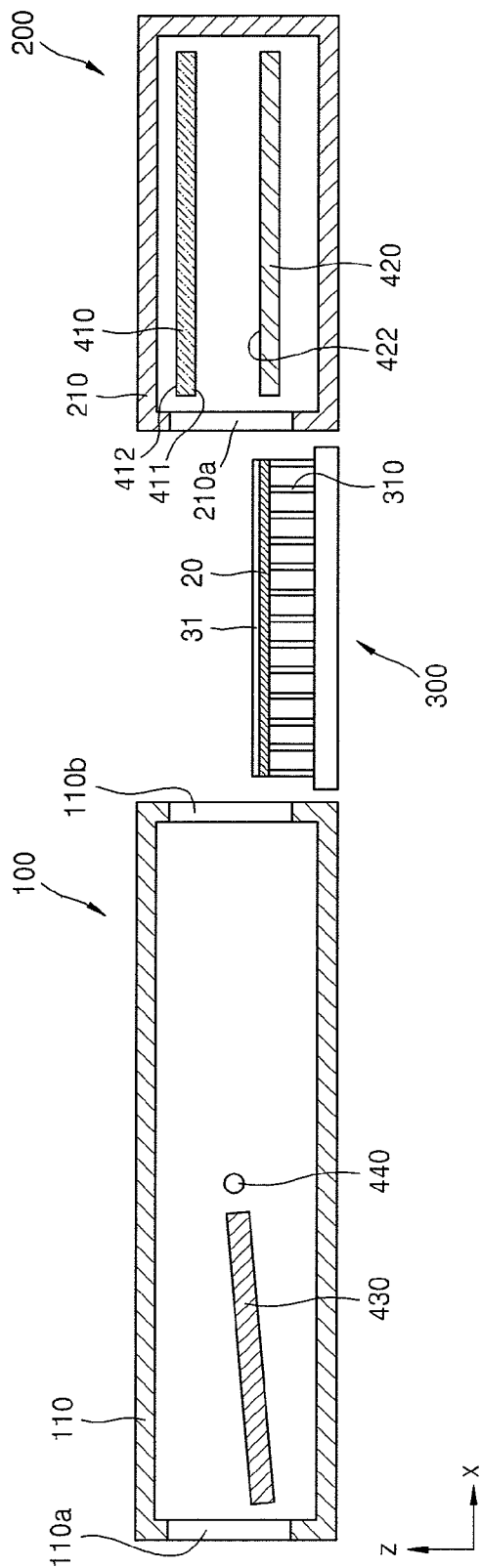

The transfer 300 can be positioned between the film attachment unit 100 and the carrier separation unit 200 to allow the display 20 separated from the carrier 10 to be safely seated. That is, after the second stage 420, to which the protection film 31 attached to the display 20 is adsorbed, is transferred to the transfer 300 from the carrier separation unit 200, as shown in FIG. 6, the display 20 is separated from the second stage 420 and is safely seated in the transfer 300.

During this process, the second stage 420 can be reversed or rotated. As shown in FIG. 6, accordingly, the display 20 is safely seated on the transfer 30 so that a second surface that is an opposite surface of the first surface of the display 20 can face the transfer 300. That is, the transfer 300 can include a plurality of pins 310 as shown in FIG. 6. The protection film 31 does not contact the pins 310 but the display 20 is safely seated on the transfer 300 so that the display 20 can contact the pins 310.

The second stage 420 can be reversed at various points. For example, as shown in FIG. 4, the display 20 is separated from the carrier 10 and is supported by the second stage 420 in the carrier separation unit 200, and the second stage 420 rotates about 180 degrees in the carrier separation unit 200. Then, as shown in FIG. 5, the second stage 420 can be transferred to the transfer 300 in the carrier separation unit 200. After the display 20 is seated in the transfer 300, the second stage 420 is moved to the carrier separation unit 200 again, rotates about 180 degrees again in the carrier separation unit 200, and as shown in FIG. 6, the film adsorption surface 422 can face upward (+z direction).

Alternatively, in some embodiments, the second stage 420 is not reversed in the carrier separation unit 200 but the second stage 420 can be reversed in an upper portion or above of the transfer 300. In this case, after the second stage 420 is transferred to the transfer 300 in the carrier separation unit 200, the second stage 420 is reversed in the upper portion of the transfer 300. Thus, as shown in FIG. 5, the film adsorption surface 422 of the second stage 420 can face the transfer 300. After the display 20 is seated in the transfer 300, the second stage 420 can rotate about 180 degrees again on the transfer 300, and then the second stage 420 can be moved to the carrier separation unit 200 again.

Meanwhile, as described with reference to FIG. 4, in a state where the display 20 is separated from the carrier 10 and thus only the carrier 10 is adsorbed to the first stage 10, the carrier 10 is removed from the first stage 410. The carrier 10 can be reused to form another display or can be discarded.

Figure 7:
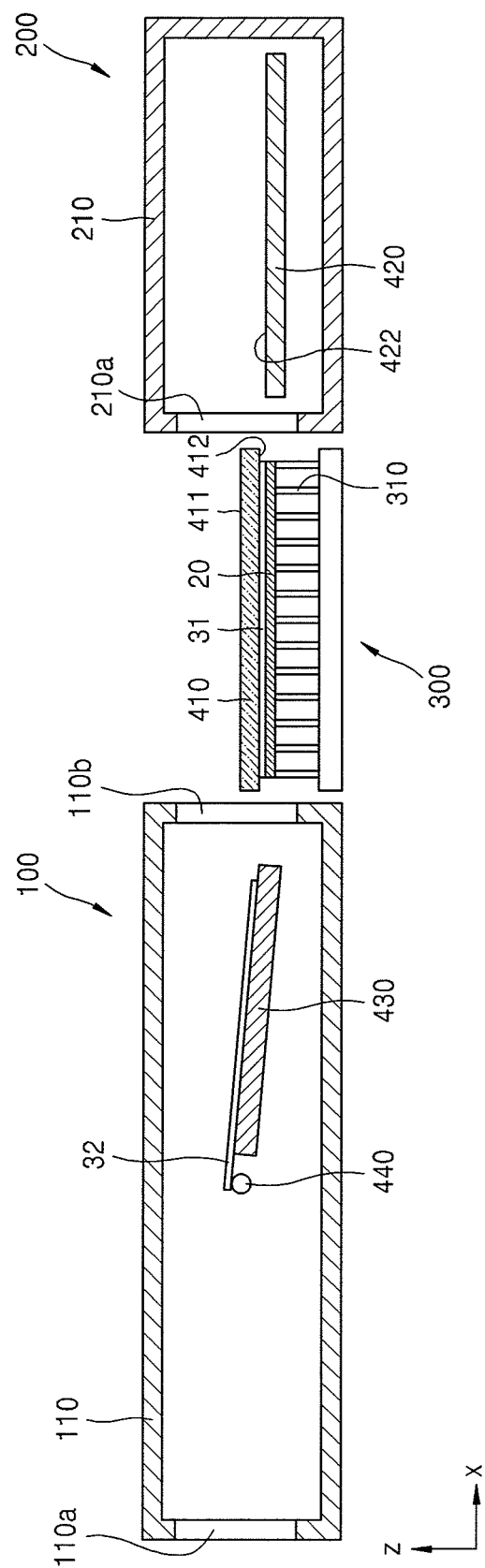

If the carrier 10 is removed from the first stage 410, the first stage 410 rotates about 180 degrees. The first stage 410 is not reversed until the display 20 is seated on the transfer 300 in FIG. 6 but the described technology is not limited thereto. For example, as shown in FIG. 6, the first stage 410 is not reversed until the display 20 is seated on the transfer 300 and then the first stage 410 is reversed in the upper portion of the transfer 300 after the first stage 410 is moved to the upper portion of the transfer 300. And, as shown in FIG. 7, the film adsorption surface 412 of the first stage 419 faces the display 20, and thus the protection film 31 on the first surface of the display 20 can be adsorbed. Alternatively, after the carrier 10 is removed from the first stage 410, the first stage 410 is reversed in the carrier separation unit 200 and the reversed first stage 410 can be moved to the upper portion of the transfer 300.

As shown in FIG. 7, the display 20 is supported by the first stage 410 again by allowing the protection film 31 on the first surface of the display 20 to be adsorbed to the film adsorption surface 412. To this end, a plurality of adsorption holes can be present in the film adsorption surface 412.

When the first stage 410 adsorbs the carrier 10, since the carrier 10 has a solid characteristic, although many adsorption holes are not present in the carrier adsorption surface 411, the carrier 10 in which the display 20 is formed can be stably adsorbed to the carrier adsorption surface 411 by strongly pumping air through the absorption holes. When the first stage 410 adsorbs the display 20 separated from the carrier 10, although the display 20 is a thin type or has a flexible characteristic, the display 20 can be supported by the first stage 410 stably while not being modified.

To this end, a plurality of adsorption holes are present in the film adsorption surface 412 while the number of the adsorption holes can be greater than that of a plurality of adsorption holes in the carrier adsorption surface 411. Accordingly, when the first stage 410 adsorbs the display 20 separated from the carrier 10, modification of the display 20 can be prevented and the display 20 can be stably adsorbed to the film adsorption surface 412 by making a pumping intensity weak.

Figure 8:
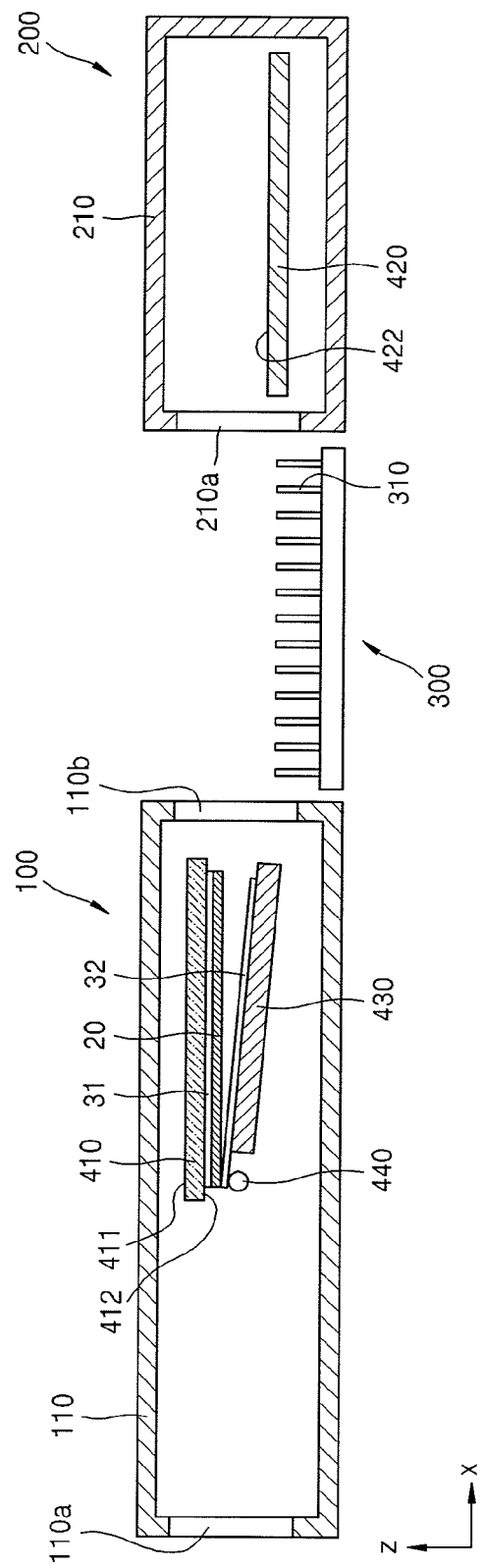
Figure 9:
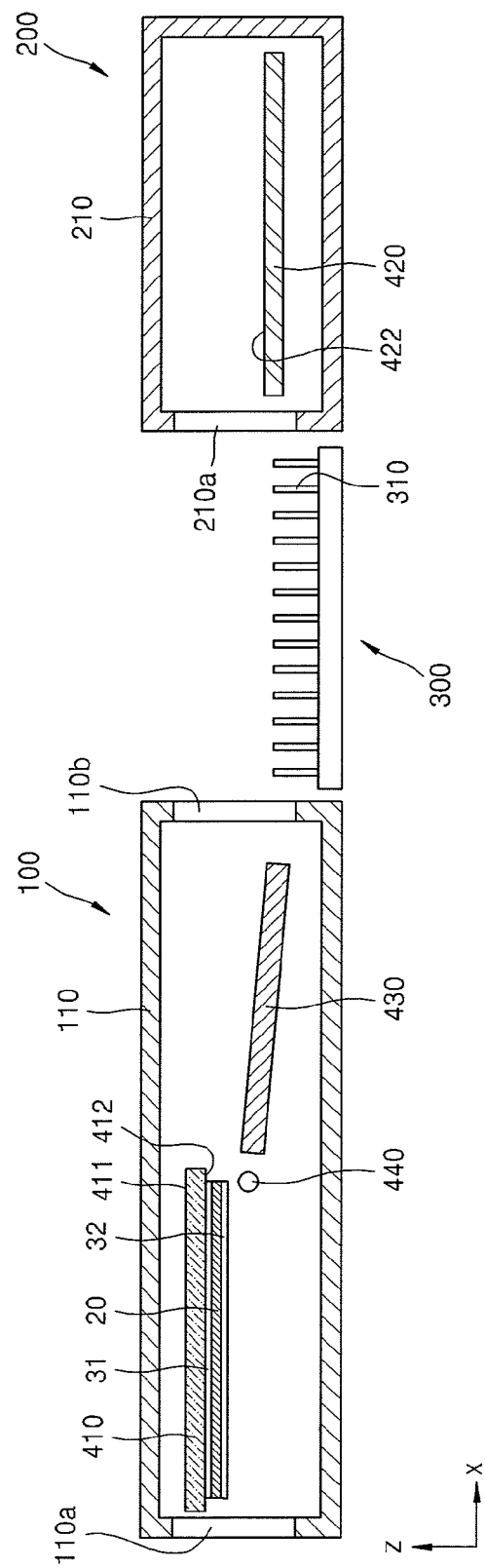

As shown in FIG. 7, after the protection film 31 on the first surface of the display 20 is adsorbed to the film adsorption surface 412 to allow the display 20 to be supported by the first stage 410 again, as shown in FIG. 8, the display 20 is transferred to the film attachment unit 100 again. As shown in FIG. 9, a protection film 32 is attached onto the second surface that is an opposite surface of the first surface of the display 20 in the film attachment unit 100.

To this end, the protection film 32 can be seated in the film stage 430 of the film attachment unit 100 in advance. That is, after the protection film 31 is attached onto the first surface of the display 20, the protection film 32 is seated on the film stage 430. In the figures, when the first stage 410 adsorbs the display 20 on the transfer 300, the protection film 32 is seated on the film stage 430 but this is for convenience of illustration, and the protection film 32 can be seated on the film stage 430 therebefore or thereafter.

Meanwhile, as shown in FIGS. 7 through 9, the film stage 430 in which the protection film 32 is seated is positioned opposite to the first main entrance 110a with respect to the roller 440 from FIG. 1. Such a movement of a location of the film stage 430 can be performed at any time after the protection film 31 is attached onto the first surface of the display 20. Seating of the protection film 32 on the film stage 430 can be performed at any time after the protection film 31 is attached onto the first surface of the display 20.

In this regard, the film 430 can be tilted in such a manner that a tip closer to the first main entrance 110a is positioned closer to the display 20 than a tip closer to the auxiliary entrance 110b as shown in FIGS. 8 and 9. In such a state, the tip closer to the first main entrance 110a of the protection film 32 is pressurized to the tip closer to the first main entrance 110a of the display 20 through the roller 440. Thereafter, if the first stage 410 is moved towards the first main entrance 110a (−x direction) from the auxiliary entrance 110b, as shown in FIG. 9, the protection film 32 is naturally separated from the film stage 430 and is attached onto the second surface of the display 20. The protection film 32 can be cut in a size corresponding to the display 20 in advance.

The protection film 32 can be adsorbed to the film stage 430 by using, for example, the vacuum adsorption method. In this case, since a plurality of adsorption holes are present in the film stage 430, the protection film 32 is seated on the film stage 430 and then air in the adsorption holes is pumped to the outside through the adsorption holes. Thus, the protection film 32 can be adsorbed onto the film stage 430. As shown in FIG. 8, before or when the protection film 32 is attached onto the display 20, the film stage 430 does not adsorb the protection film 32 any longer by using the vacuum adsorption method but the protection film 32 can be simply laid on the film stage 430.

As described above, after the protection film 32 is attached onto the second surface of the display 20, the display 20 is supported by or separated from the first stage 410 and is discharged to the outside of the film attachment unit 100 through the first main entrance 100a. The method of manufacturing the display apparatus of the present embodiment can include attaching the protection films 31 and 32 onto the first and second surfaces of the display 20 in the one film attachment unit 100. Thus, a configuration of the manufacturing apparatus is dramatically simplified and a space occupied by the manufacturing apparatus is reduced, thereby increasing space efficiency and manufacturing efficiency.

Figure 10:
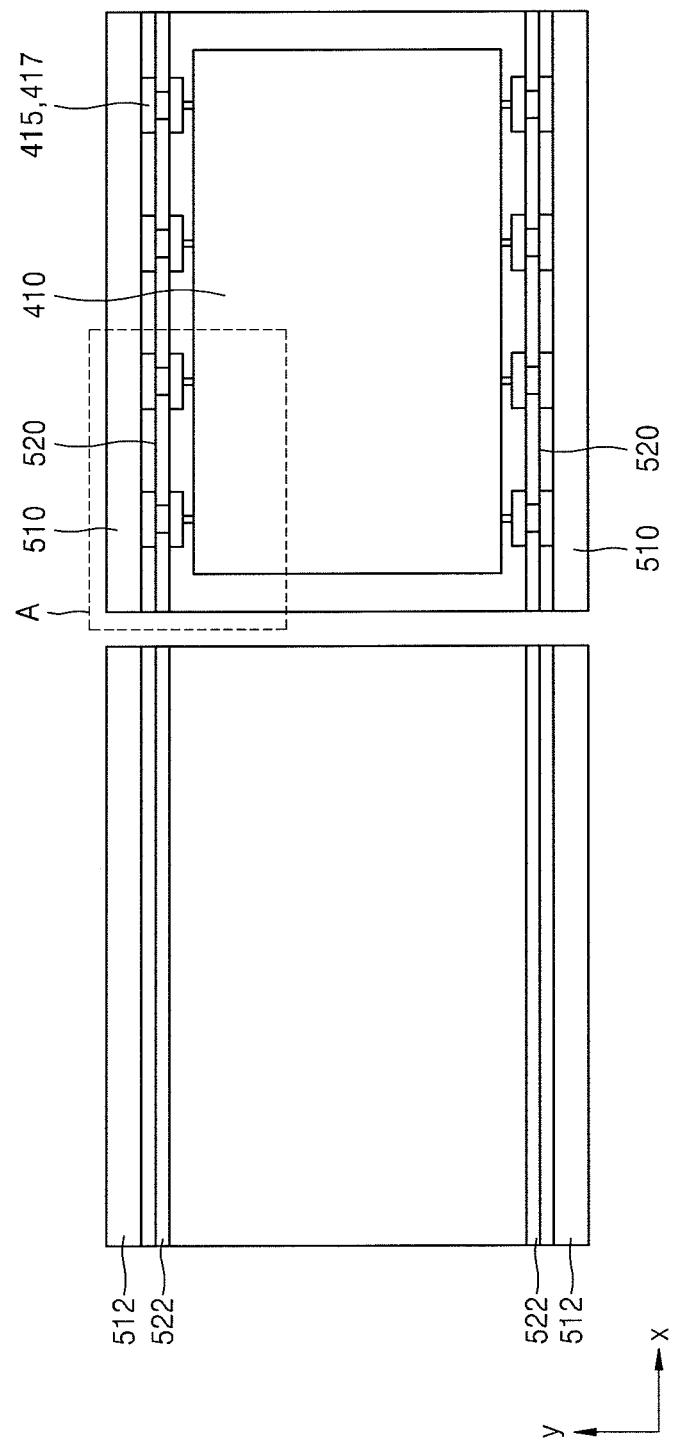
FIG. 10 is a schematic plan view of a part of an apparatus for manufacturing a display device, according to an embodiment.
Figure 11:
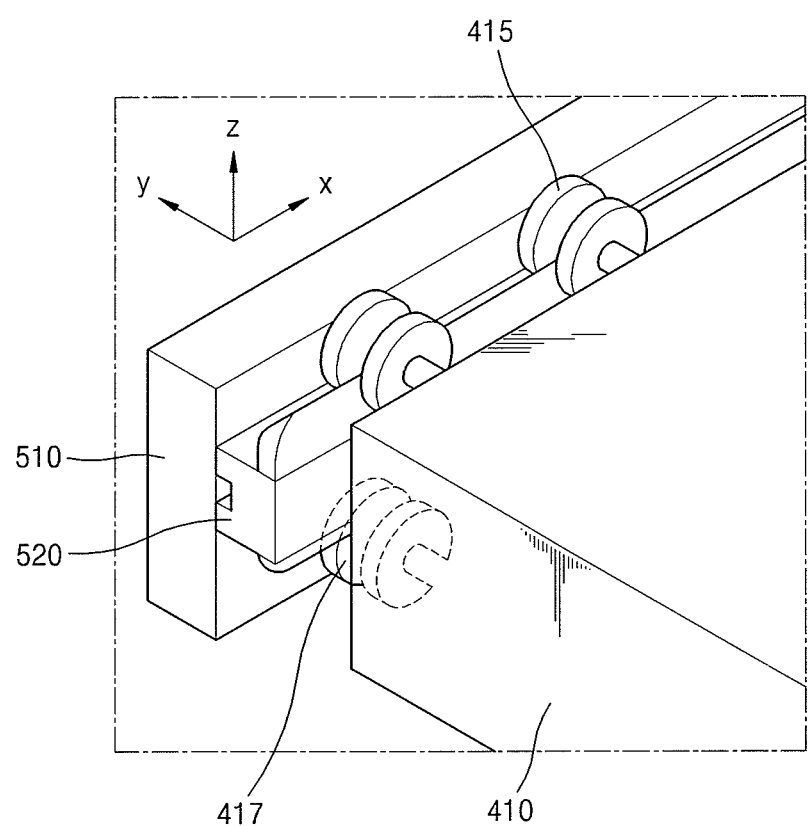
FIG. 11 is a schematic enlarged perspective view of a part of FIG. 10.

FIG. 10 is a schematic plan view of a part of a machine for manufacturing a display panel, according to an embodiment. FIG. 11 is a schematic enlarged perspective view of a part of FIG. 10. FIGS. 10 and 11 exemplarily explain methods of moving and reversing the first stage 410 but the described technology is not limited thereto.

The first stage 410 can include wheels 415 and 417 and move rails 520 and 522 attached to transfer frames 510 and 512. The transfer frames 510 and 512 can be spaced apart from each other by a gap having a predetermined size, and this also applies to the rails 520 and 522. However, although the transfer frames 510 and 512 are spaced apart from each other by the gap, the first stage 410 can pass through the corresponding spaced gap and move from the transfer frame 510 to the transfer frame 512 or in a reverse direction.

Wheels 415 and 417 rotatably fixed and spaced up and down (in a z axis direction) are provided in a side surface of a direction of the rail 520 of the first stage 410. In this case, the rail 520 is positioned between the wheels 415 and 417 spaced up and down in the side surface of the first stage 410 so that the first stage 410 can be transferred on the rail 520 by changing a rotation direction of the upper wheel 415 and a rotation direction of the lower wheel 417 to be the opposite. The first stage 410 can be reversed by rotating the transfer frame 510, the rail 520, and the first stage 410 by about 180 degrees (with respect to a y axis). The second stage 420 can also be moved or reversed in the same/similar way.

Meanwhile, the film stage 430 is moved to the first main entrance 110a or the auxiliary entrance 110b with respect to the roller 440 in FIGS. 1 through 9 but the described technology is not limited thereto.

For example, a location of the film stage 430 is fixed in a transfer direction (+x direction or −x direction) of the first stage 410, and the roller 440 can be moved to the first main entrance 110a or the auxiliary entrance 110b. Alternatively, the location of the film stage 430 can be fixed in the transfer direction (+x direction or −x direction) of the first stage 410, and rollers can be positioned in the first main entrance 110a and the auxiliary entrance 110b of the film stage 430. In this case, when the protection film 31 is attached to the display 20, a roller of the auxiliary entrance 110b can be used, and when the protection film 32 is attached to the display 20, a roller of the first main entrance 110a can be used. In this regard, although the location of the film stage 430 is fixed to the first main entrance 110*a* or the auxiliary entrance 110*b*, the film stage 430 can still be tilted as shown in FIG. 1 or 8.

When the roller are positioned in the first main entrance 110*a* and the auxiliary entrance 110*b* of the film stage 430, locations of the roller are fixed with respect to the film stage 430, and the film stage 430 can be tilted as shown in FIG. 1 or 8. In this case, according to the tilting of the film stage 430 as shown in FIG. 1 or 8, when the protection film 31 is attached to the display 20, the roller can pressurize the protection film 31 in the direction of the auxiliary entrance 100*b*, and when the protection film 32 is attached to the display 20, the roller can pressurize the protection film 32 in the direction of the first main entrance 110*a*.

A method of manufacturing the display apparatus is described but the described technology is not limited thereto. A manufacturing apparatus used in the manufacturing method can belong to the scope of the described technology.

For example, an apparatus for manufacturing the display apparatus according an embodiment includes the film attachment unit 100, the carrier separation unit 200, the transfer 300 placed between the film attachment unit 100 and the carrier separation unit 200, the first stage 410, the second stage 420, and the film stage 430. The film attachment unit 100 can allow the protection films 31 and 32 to be attached to the display 20. The carrier separation unit 200 can separate the display 20 from the carrier 10 supporting the display 20. The transfer 300 can allow the display 20 separated from the carrier 10 to be seated. The first stage 410 can go and come between the film attachment unit 100 and the carrier separation unit 200, include the carrier adsorption surface 411 that can adsorb the carrier 10 in which the display 20 is formed in one surface, and the film adsorption surface 412 that can adsorb the protection film 31 attached to the display 20 in another surface. The second stage 420 includes the film adsorption surface 422 that can adsorb the protection film 31 attached to the display 20. The film stage 430 can adsorb the protection films 31 and 32 that are to be attached to the first and second surfaces of the display 20. Each of elements of the apparatus for manufacturing the display apparatus according the present embodiment is the same as described with reference to the manufacturing method above.

As described above, according to at least one of the disclosed embodiments, a method of manufacturing a display apparatus having a simplified configuration and a manufacturing apparatus for the same can be implemented. The scope of the described technology is not limited by the effects.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details can be made therein without departing from the spirit and scope as defined by the following claims.

What is claimed is:

1. A method of manufacturing a display device, the method comprising:

placing a carrier, in which a display panel is formed, into a film attachment portion such that the carrier is pulled onto a carrier adsorption surface of a first stage;

attaching a first protection film onto a first surface of the display panel in the film attachment portion, wherein the first surface is located opposite to a second surface of the display panel that faces the carrier;

first transferring the first stage to a carrier separation portion;

separating the display panel from the carrier;

second transferring the display panel to a second stage such that the attached protection film is pulled onto a second film adsorption surface of the second stage;

third transferring the second stage, on which the attached protection film is pulled from the carrier separation portion, to a transfer portion;

separating the display panel from the second stage;

placing the display panel on the transfer portion such that the second surface faces the transfer portion;

removing the carrier from the first stage after separating the display panel from the carrier;

fourth transferring the display panel to the film attachment portion such that the first protection film is pulled onto a first film adsorption surface of the first stage so that the display panel is supported via the first stage; and attaching a second protection film onto the second surface of the display panel in the film attachment portion.

2. The method of claim 1, further comprising rotating the second stage, between the second transferring and the third transferring.

3. The method of claim 1, further comprising rotating the second stage, between the third transferring and the separating.

4. The method of claim 1, further comprising rotating the first stage, between the removing and the fourth transferring.

5. The method of claim 1, wherein the transfer portion is positioned between the film attachment portion and the carrier separation portion.

6. The method of claim 1, wherein the film attachment portion comprises a first chamber body including a first main entrance located at one side thereof and an auxiliary entrance located at another side thereof, wherein the display panel is configured to be inserted or removed through the first main entrance or the auxiliary entrance, wherein the carrier separation portion comprises a second chamber body comprising a second main entrance located at one side thereof, wherein the display panel is further configured to be inserted or removed through the second main entrance, wherein the second main entrance corresponds to the auxiliary entrance of the film attachment portion, wherein the first transferring is performed through the auxiliary entrance of the film attachment portion and the second main entrance of the carrier separation portion, wherein the third transferring is performed through the second main entrance of the carrier separation portion, and wherein the fourth transferring is performed through the auxiliary entrance of the film attachment portion.

7. The method of claim 1, wherein one surface of the first stage includes the carrier adsorption surface and the other surface of the first stage includes the first film adsorption surface.

8. The method of claim 7, wherein a plurality of first and second adsorption holes are respectively formed in the first film adsorption surface and carrier adsorption surface, and wherein the number of the first adsorption holes is greater than the number of the second adsorption holes.

* * * * *